United States Patent
Kijima

(10) Patent No.: US 8,022,855 B2
(45) Date of Patent: Sep. 20, 2011

(54) ANALOG/DIGITAL CONVERTER

(75) Inventor: Masashi Kijima, Kasugai (JP)

(73) Assignee: Fujitsu Semiconductor Limited, Yokohama (JP)

( * ) Notice: Subject to any disclaimer, the term of this patent is extended or adjusted under 35 U.S.C. 154(b) by 0 days.

(21) Appl. No.: 12/695,031

(22) Filed: Jan. 27, 2010

(65) Prior Publication Data

US 2010/0194620 A1    Aug. 5, 2010

(30) Foreign Application Priority Data

Jan. 30, 2009 (JP) .................................. 2009-020641

(51) Int. Cl.
*H03M 1/36* (2006.01)
(52) U.S. Cl. ........................................ 341/160; 341/155
(58) Field of Classification Search ........... 341/125–170
See application file for complete search history.

(56) References Cited

U.S. PATENT DOCUMENTS

| | | | |
|---|---|---|---|
| 6,298,459 B1 | 10/2001 | Tsukamoto | |
| 6,388,602 B1 * | 5/2002 | Yang | 341/159 |
| 6,459,394 B1 * | 10/2002 | Nadi et al. | 341/120 |
| 6,653,956 B2 | 11/2003 | Tsukamoto | |
| 6,703,951 B2 | 3/2004 | Tsukamoto | |
| 6,812,880 B2 * | 11/2004 | Paulus | 341/164 |
| 7,286,072 B2 * | 10/2007 | Sakata et al. | 341/155 |
| 7,605,736 B2 | 10/2009 | Noguchi | |
| 7,675,440 B1 * | 3/2010 | Xiao et al. | 341/118 |
| 7,696,917 B2 * | 4/2010 | Matsuura et al. | 341/160 |
| 7,889,110 B2 * | 2/2011 | Tayu | 341/159 |
| 7,889,111 B2 * | 2/2011 | Kawahito | 341/162 |

FOREIGN PATENT DOCUMENTS

| | | |
|---|---|---|
| JP | H11-88174 | 3/1999 |
| JP | 2006-074415 | 3/2006 |

* cited by examiner

*Primary Examiner* — Lam T Mai

(74) *Attorney, Agent, or Firm* — Fujitsu Patent Center

(57) ABSTRACT

An A/D converter includes a plurality of comparators that performs sampling of a plurality of reference voltages and analog input signals during a sampling time, and compares each of the plurality of reference voltages with each of the plurality of analog signals during a comparison time. The A/D converter detects bubbles in thermometer codes obtained from output signals of the plurality of comparators and adjusts a ratio of the sampling time and the comparison time of the plurality of comparators so as to reduce the bubbles.

12 Claims, 20 Drawing Sheets

FIG.3

| NO BUBBLE IS GENERATED | | | BUBBLE IS GENERATED | | |
|---|---|---|---|---|---|
| THERMOMETER CODE | BINARY CODE | | THERMOMETER CODE | BINARY CODE | |
| 07 | 0 | D2 | 07 | 0 | D2 ? |
| 06 | 0 | D1 | 06 | 0 | D1 ? |
| 05 | 0 | D0 | 05 | 1 | D0 ? |
| 04 | 0 | | 04 | 0 | |
| 03 | 1 | | 03 | 1 | |
| 02 | 1 | | 02 | 1 | |
| 01 | 1 | | 01 | 1 | |

BUBBLE (points to the "1" in row 05 of the bubble-generated thermometer code)

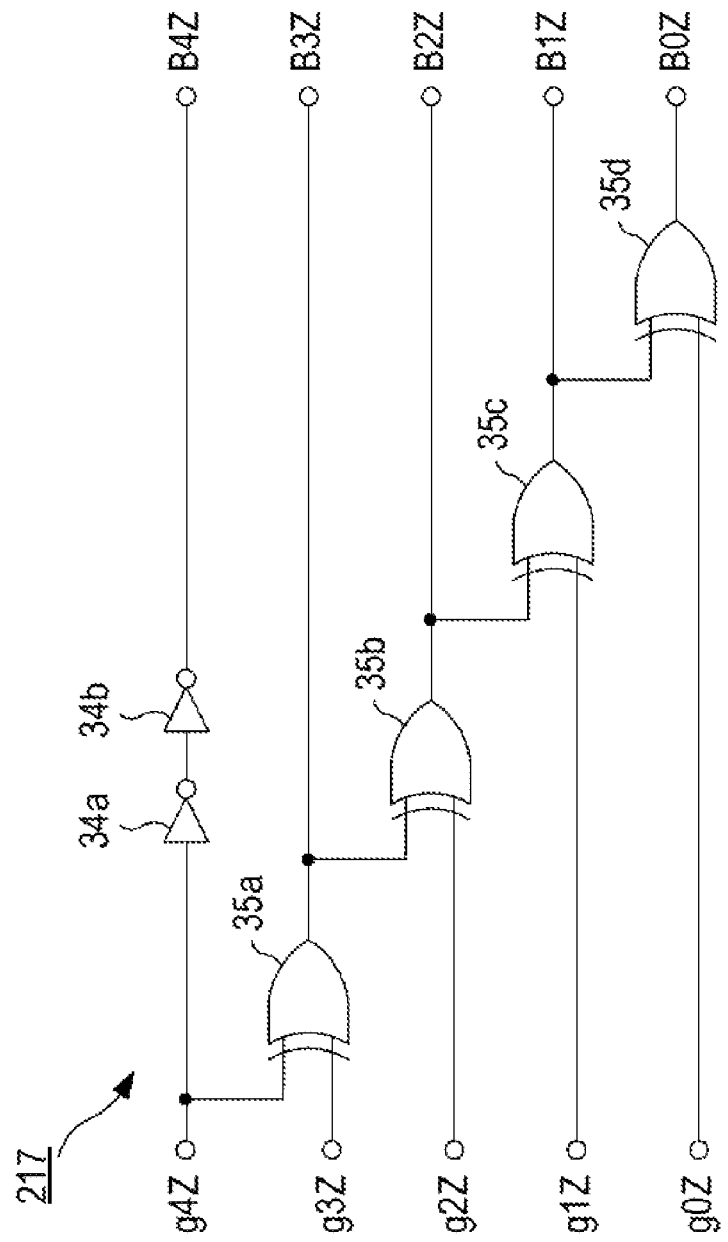

ANALOG/DIGITAL CONVERTER

CROSS-REFERENCE TO RELATED APPLICATIONS

This application is based upon and claims the benefit of priority of the prior Japanese Patent Application No. 2009-20641, filed on Jan. 30, 2009, the entire contents of which are incorporated herein by reference.

FIELD

The present disclosure relates generally to an analog/digital (A/D) converter that converts an analog signal into a digital signal.

BACKGROUND

Recently, A/D converters have been used for various electronic devices, and improvement of the conversion speed and accuracy has been demanded.

FIG. 1 is a block diagram illustrating an example of a conventional A/D converter that is a 3-bit parallel A/D converter.

As illustrated in FIG. 1, the A/D converter includes a control signal generation circuit 101, an encoder 102, a reference voltage generation circuit 103, and a plurality of comparators C1 to C7.

The control signal generation circuit 101 receives a reference clock CLK and generates a comparator control signal CNT1 for comparators C1 to C7 and an encoder control signal CNT2 for the encoder 102.

The A/D converter is an N bit (3-bit) parallel A/D converter that converts output signals O1 to O7 of the number of 2N−1 (seven) comparators C1 to C7 into thermometer codes, and outputs the digital signals (binary codes) converted by the encoder 102.

The reference voltage generation circuit 103 includes eight resistances R that are serially coupled between a high potential reference voltage VRH and a low potential reference voltage VRL, and a reference voltage for respective comparators C1 to C7 is taken out from a node that couples two adjacent resistances. Note that among eight resistances R, resistances of both ends to which reference voltages VRH and VRL are directly applied are set, for example, to a half of the other resistances.

FIG. 2 illustrates an operation of a comparator of the A/D converter illustrated in FIG. 1.

As illustrated in FIG. 2, a comparator control signal CNT1 from the control signal generation circuit 101 in the A/D converter illustrated in FIG. 1 has substantially the same duty ratio (duty) as the reference clock CLK that is 50% (0.5). The duty ratio is defined as a ratio of a time in one cycle in which a pulse is at a high level H.

Thus, the comparators C1 to C7 perform sampling for a period of a half of one cycle, and perform comparison for the remaining half period.

Relative variations (for example, manufacturing variations) exist among the number of 2N−1 (seven) comparators C1 to C7 in the above described A/D converter. Hence, the sampling and comparison accuracies differ depending on comparators.

The longer the processing times (sampling time and comparison time) are, the more accurate the sampling processing and comparison processing becomes. Insufficient sampling time and comparison time cause bubbles in thermometer codes due to relative variations among comparators C1 to C7, and thereby characteristics of the A/D converter may be degraded.

FIG. 3 illustrates generation of bubbles in the A/D converter illustrated in FIG. 1. The left half of the figure illustrates a case in which no bubble is generated, while the right half illustrates a case where a bubble is generated at the output O5 of the comparator C5.

In other words, the thermometer codes O1 to O7 output from the comparators C1 to C7 become "1110000" when no bubble is generated and the 3-bit digital signal D0 to D2 is correctly output as "110."

On the other hand, when a bubble is generated at the thermometer code O5 output from the comparators C1 to C7, the thermometer codes O1 to O7 become "1110100" and the encoder 102 does not output digital signals D0 to D2.

A related technique is known that ignores a thermometer code in which a bubble is generated, in other words, assumes the thermometer code as 0 and outputs digital signals D0 to D2.

As described above, an A/D converter with an encoder provides a function to correct a bubble error in an input thermometer code. This encoder includes an encode unit that generates a digital signal of a Gray code by detecting a logic border of a thermometer code and a Gray-binary conversion unit that converts a Gray code output from the encode unit into a digital signal of a binary code.

The encode unit includes an error detection unit that detects whether or not two values of bits of Gray codes have a specific relation, and thereby detects an error code included in the Gray codes. Furthermore, the encode unit includes an error correction unit that corrects error codes detected by the error detection unit.

Moreover, an A/D converter is proposed that controls a duty ratio of a sampling clock depending on conditions.

The proposed A/D converter includes a sample hold circuit, an A/D converter circuit, an A/D output determination circuit, and a sample clock generation circuit. An analog input signal is input to the sample-hold circuit. The sample-hold circuit operates based on a sample clock. The A/D conversion circuit generates a digital output signal from an output of the sample-hold circuit.

The A/D output determination circuit outputs a duty control signal based on the digital output signal. The sample clock generation circuit adjusts a duty ratio of the sampling clock based on the duty control signal and supplies the sample clock to the sample-hold circuit.

As described above, there are A/D converters that generate bubble errors due to relative variations among comparators in which sampling and comparison accuracies differ depending on comparators.

Moreover, an A/D converter is known that ignores a thermometer code in which a bubble is generated and outputs binary codes, however such A/D converter causes reduction of conversion accuracy.

SUMMARY

An A/D converter includes a plurality of comparators that performs sampling of a plurality of reference voltages and analog input signals during a sampling time, and compares each of the plurality of reference voltages with each of the plurality of analog signals during a comparison time, and the A/D converter detects bubbles in thermometer codes obtained from output signals of the plurality of comparators and adjusts a ratio of the sampling time and the comparison time of the plurality of comparators so as to reduce the bubbles.

The object and advantages of the invention will be realized and attained by means of the elements and combinations particularly pointed out in the claims.

It is to be understood that both the foregoing general description and the following detailed description are exemplary and explanatory and are not restrictive of the invention, as claimed.

BRIEF DESCRIPTION OF DRAWINGS

FIG. 3 illustrates a generation of a bubble in the A/D converter illustrated in FIG. 1;

FIG. 20 is a circuit diagram illustrating one example of a Gray-to-binary conversion unit in the encoder illustrated in FIG. 13.

DESCRIPTION OF EMBODIMENTS

Hereunder, embodiments of an A/D converter will be described by referring to the accompanying drawings.

Figure 1:
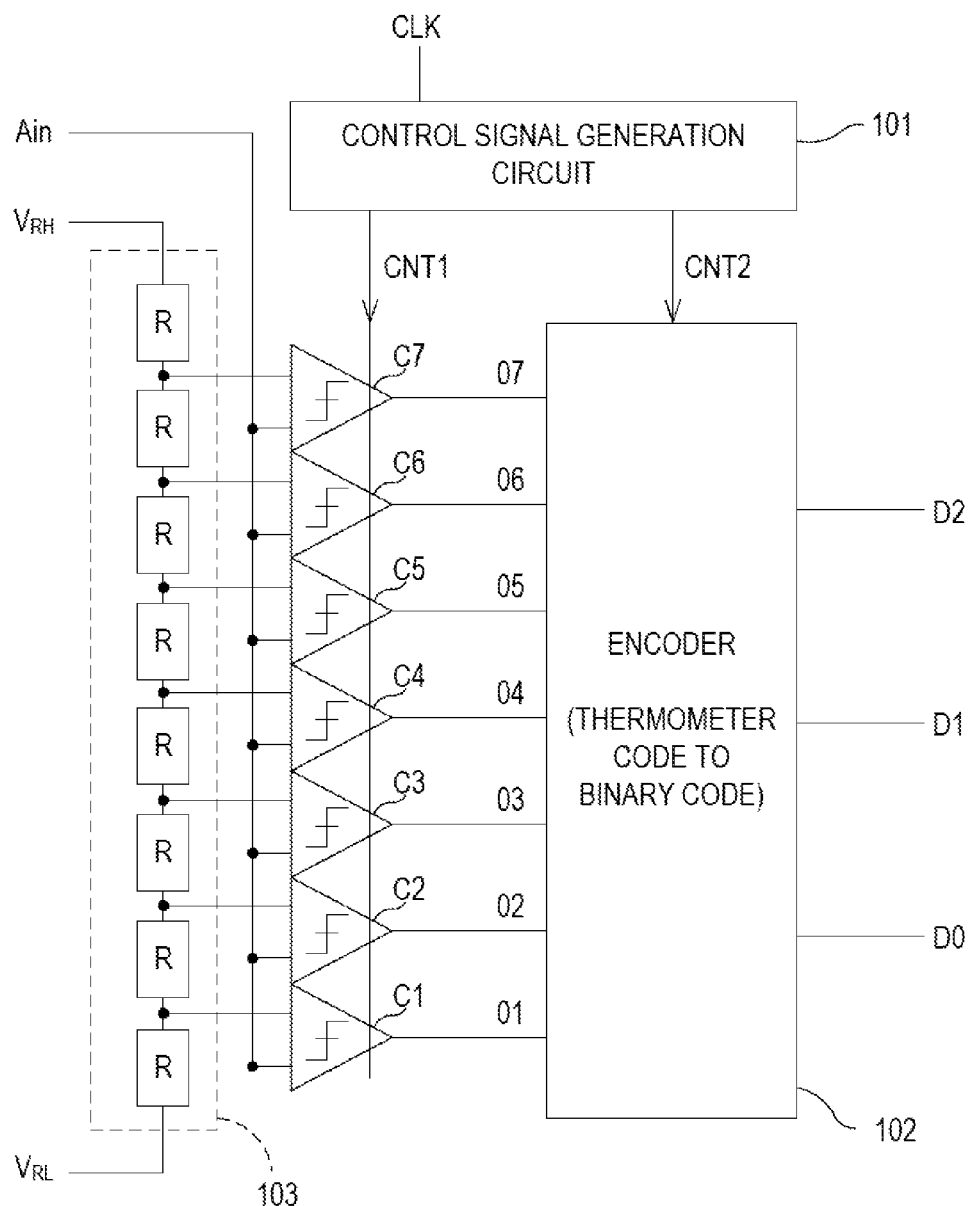
FIG. 1 illustrates a block diagram illustrating an example of a conventional A/D converter.
Figure 2:
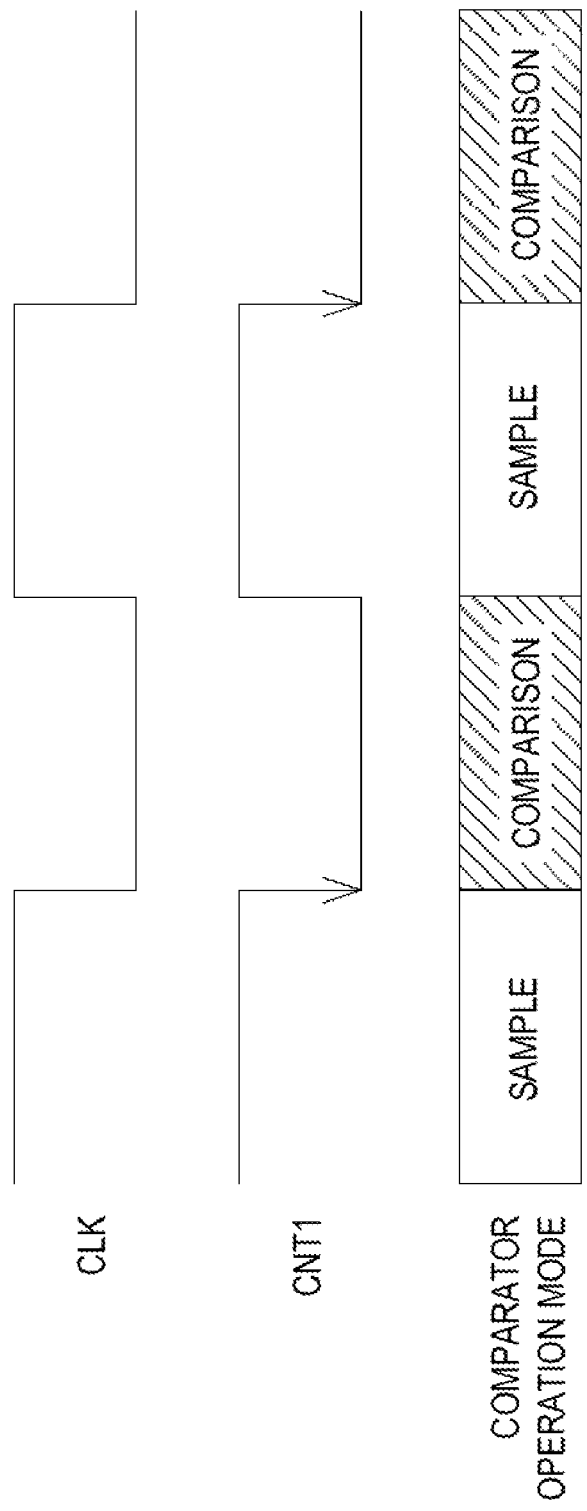
FIG. 2 illustrates an operation of a comparator in the A/D converter illustrated in FIG. 1.
Figure 4:
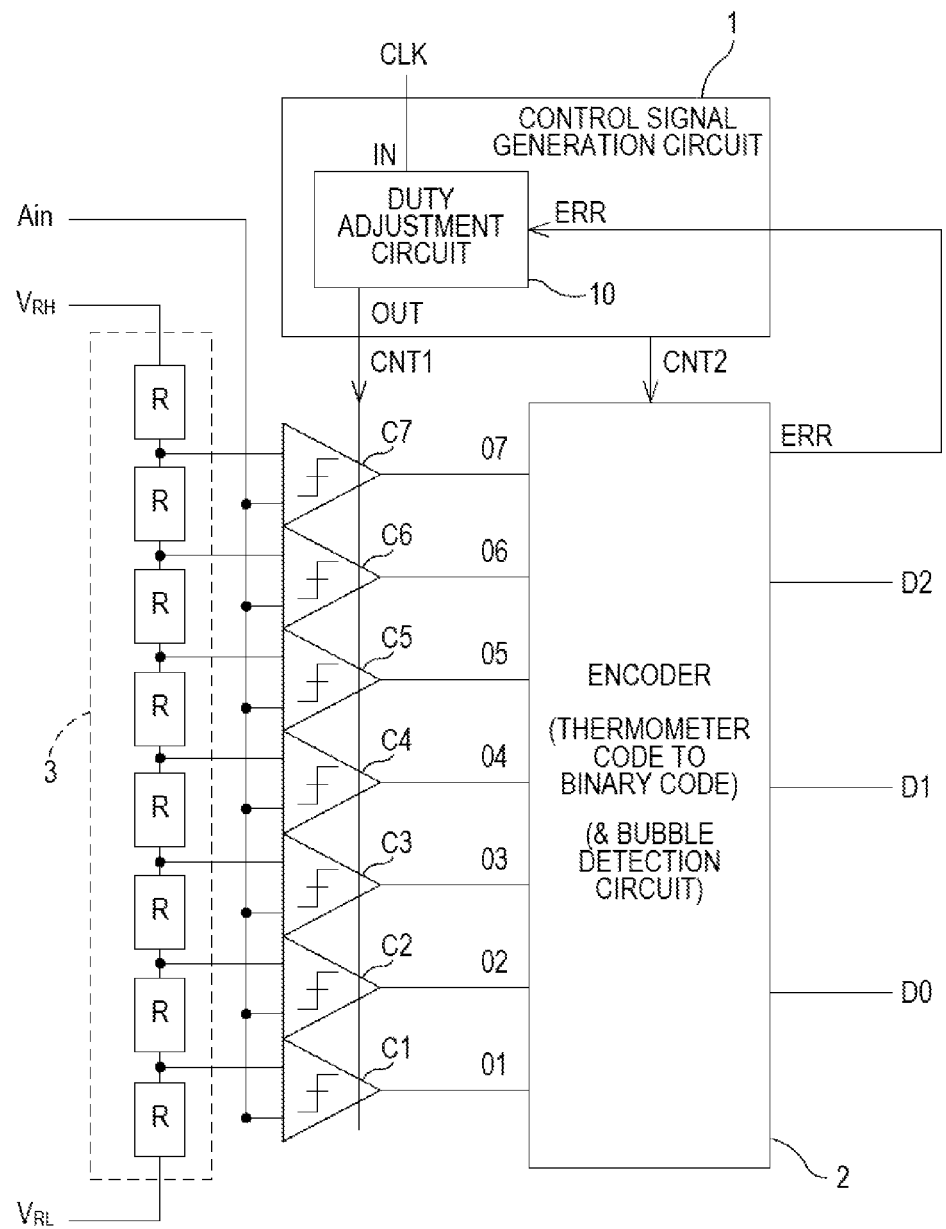
FIG. 4 is a block diagram illustrating one embodiment of an A/D converter.

FIG. 4 is a block diagram illustrating an example of an embodiment of an A/D converter and illustrates an example of a 3-bit parallel A/D converter.

As illustrated in FIG. 4, the A/D converter includes a control signal generation circuit 1, an encoder (and a bubble detection circuit) 2, a reference voltage generation circuit 3, and a plurality of comparators C1 to C7.

The control signal generation circuit 1 receives a reference clock CLK and generates a comparator control signal CNT1 for the comparators C1 to C7 and an encoder control signal CNT2 for the encoder 2.

The control signal generation circuit 1 includes a duty adjustment circuit 10 that receives a bubble detection signal ERR from a bubble detection circuit of the encoder 2 and adjusts a duty ratio of the comparator control signal CNT 1.

The A/D converter illustrated in FIG. 4 is an example of an N bit (3 bit) parallel A/D converter that converts output signals O1 to O7 of the number of 2N−1 (seven) comparators C1 to C7 into thermometer codes. The encoder 2 converts the thermometer codes into binary code signals and outputs 3-bit digital signals D0 to D2.

The reference voltage generation circuit 3 includes eight resistances R that are serially coupled between a high potential reference voltage VRH and a low potential reference voltage VRL, and reference voltages for respective comparators C1 to C7 are taken out from a node that couples adjacent two resistances. Note that among eight resistances R, resistances of both ends to which reference voltages VRH and VRL are directly applied are set, for example, to a half of that of other resistances.

The comparators C1 to C7 perform sampling of different reference voltages from the reference voltage generation circuit 3 and analog input signals Ain and compare the reference voltages with the analog input signals for the comparison time, and outputs output signals O1 to O7 respectively.

The encoder 2 (bubble detection circuit) detects an occurrence of a bubble at the thermometer codes O1 to O7, and outputs a bubble detection signal ERR.

Figure 5:
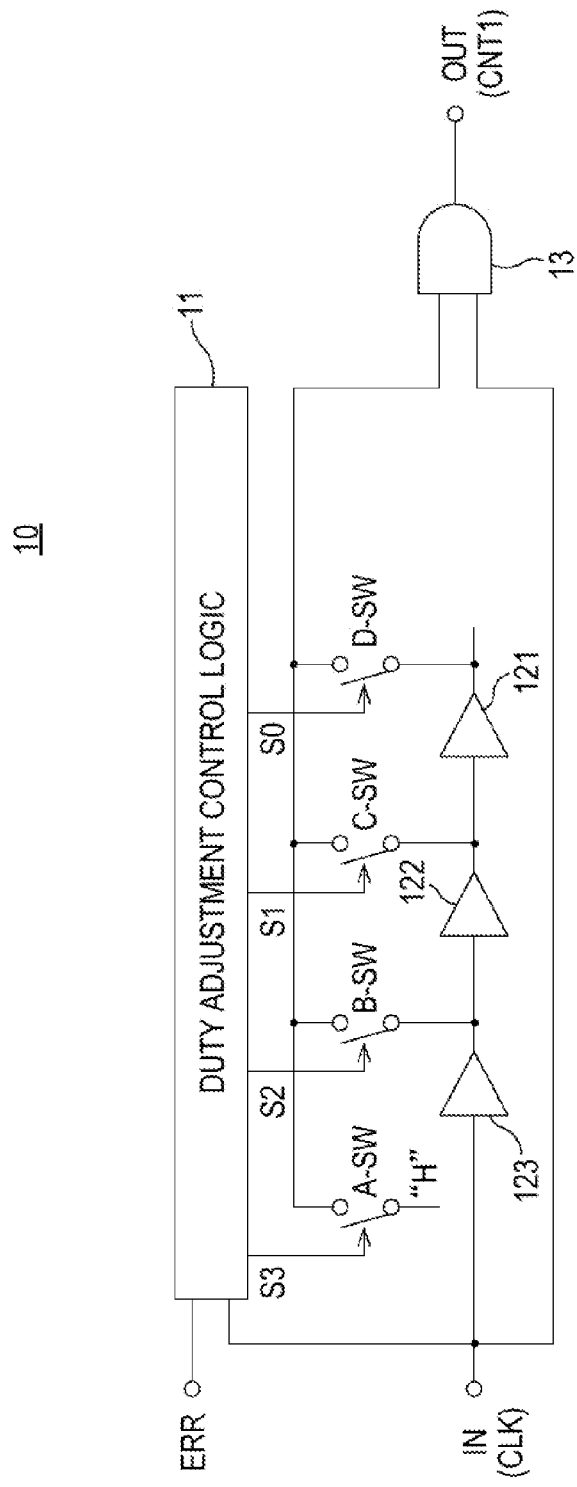
FIG. 5 is a block diagram illustrating an example of a duty adjustment circuit in the A/D converter illustrated in FIG. 4.

FIG. 5 is a block diagram illustrating an example of a duty adjustment circuit of the A/D converter illustrated in FIG. 4.

As illustrated in FIG. 5, a duty adjustment circuit 10 includes a duty adjustment control logic 11, switches A-SW, B-SW, C-SW, and D-SW, delay buffers 121 to 123, and an AND gate 13.

The number of switches and stages of delay buffers may be changed depending on a frequency of a reference clock CLK, a delay time of a delay buffer, and/or an accuracy of a duty adjustment, etc.

Switches A-SW, B-SW, C-SW, and D-SW may be ON/OFF controlled by switch control signals S3, S2, S1 and S0 from the duty adjustment control logic 11.

A ratio of a sampling time and a comparison time of a comparator control signal CNT1 for controlling comparators C1 to C7 is controlled by activating one of switch control signals S3, S2, S1, or S0 to select a corresponding switch.

When comparators C1 to C7 provide latch functions, processing of a comparison time includes retaining (holding) an analog input signal Ain and a reference voltage that are sampled for a sampling time and performing determination (comparison).

A sample edge of the duty adjustment circuit illustrated in FIG. 5 does not shift forward or backward regardless of the duty adjustment result, and thus, the duty adjustment circuit may be used while the A/D converter is in operation. The sampling edge is preferable for an A/D converter in which high accuracy and wide bandwidth with a small jitter is preferred because only one stage of the AND gate 13 exists on an input and output route. Moreover, for example, a reset signal, etc. of the A/D converter may be used as a trigger for initiating a duty adjustment.

The duty adjustment circuit illustrated in FIG. 5 is just one example and various circuits may be applied that control switches A-SW to D-SW so as to decrease the number of counts of the bubble detection signals ERR.

Figure 6:
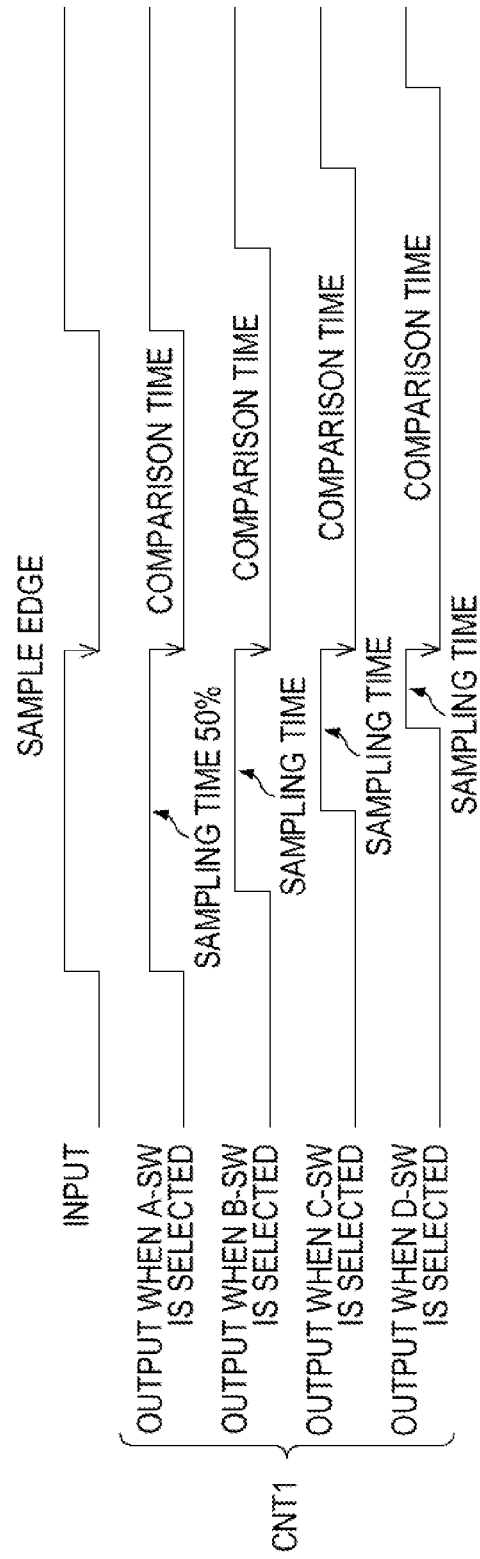
FIG. 6 illustrates input and output signals of the duty adjustment circuit illustrated in FIG. 5.

FIG. 6 illustrates input and output signals of the duty adjustment circuit illustrated in FIG. 5.

As illustrated in FIG. 6, for example, when a switch control signal S3 is activated to turn a switch A-SW on, the duty ratio of the comparator control signal CNT1 becomes 50% which is substantially the same as that of the reference clock CLK in which a sampling time and a comparison time are substantially equal.

Moreover, the comparator control signal CNT 1 is adjusted so that the comparison time becomes longer by reducing a sampling time sequentially by switching to signals that passes the delay buffer 123 in the first stage, the delay buffers 123 and 122 in the second stage, the delay buffer 123, 122, and 121 in the third stage.

The sample edge (the timing when sample processing switches to comparison processing) is conducted in a substantially constant timing that is substantially synchronized with the reference clock, even when any of the switches A-SW to D-SW is turned on.

As described above, according to this embodiment, accuracy of A/D conversion may be improved by adjusting a duty ratio of a comparator control signal and reducing generation of bubbles in thermometer codes obtained from output signals of a plurality of comparators.

Moreover according to this embodiment, a faster and more accurate A/D converter may be achieved because a duty ratio of a comparator control signal may be adjusted to a substantially optimum value depending on processes (processing recipe), a power-supply voltage, and ambient temperature of an A/D converter (semiconductor device).

The above described adjustment of the duty ratio of the comparator control signal may be performed before starting operation of the A/D converter as a calibration of the A/D converter such as an initialization process of an electronic device to which the A/D converter is provided.

Alternatively, adjustment of a duty ratio of a comparator control signal may be performed in background during operation of the A/D converter, because the sample edge occurs in a substantially constant timing that is substantially synchronized with the reference clock CLK even if the duty ratio is changed.

When a bubble is generated in a thermometer code, the thermometer code is ignored and digital conversion is performed to output digital signals D0 to D2.

Figure 7:
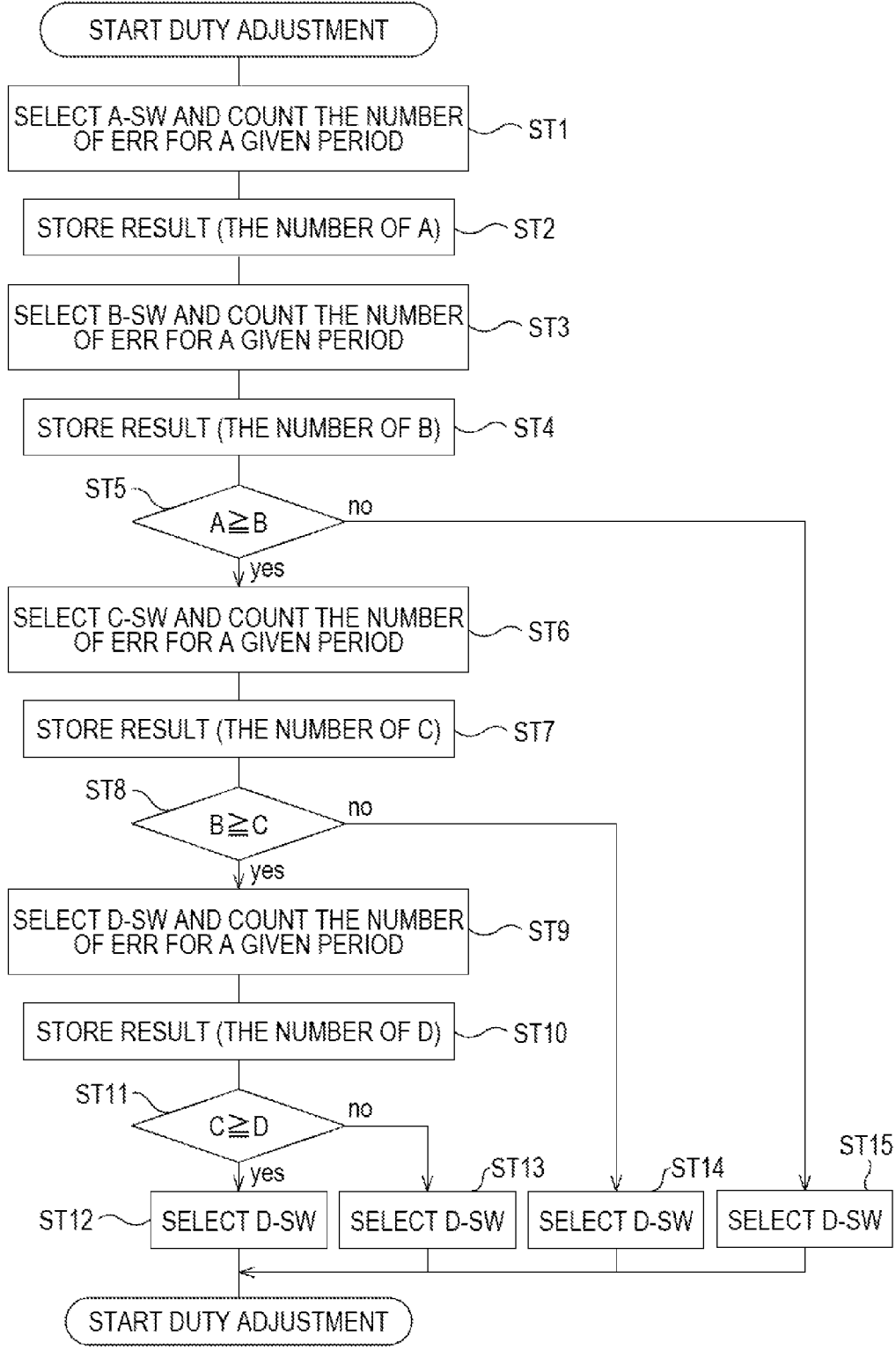
FIG. 7 is a flow chart illustrating a duty adjustment processing in the duty adjustment circuit illustrated in FIG. 5.
Figure 8:
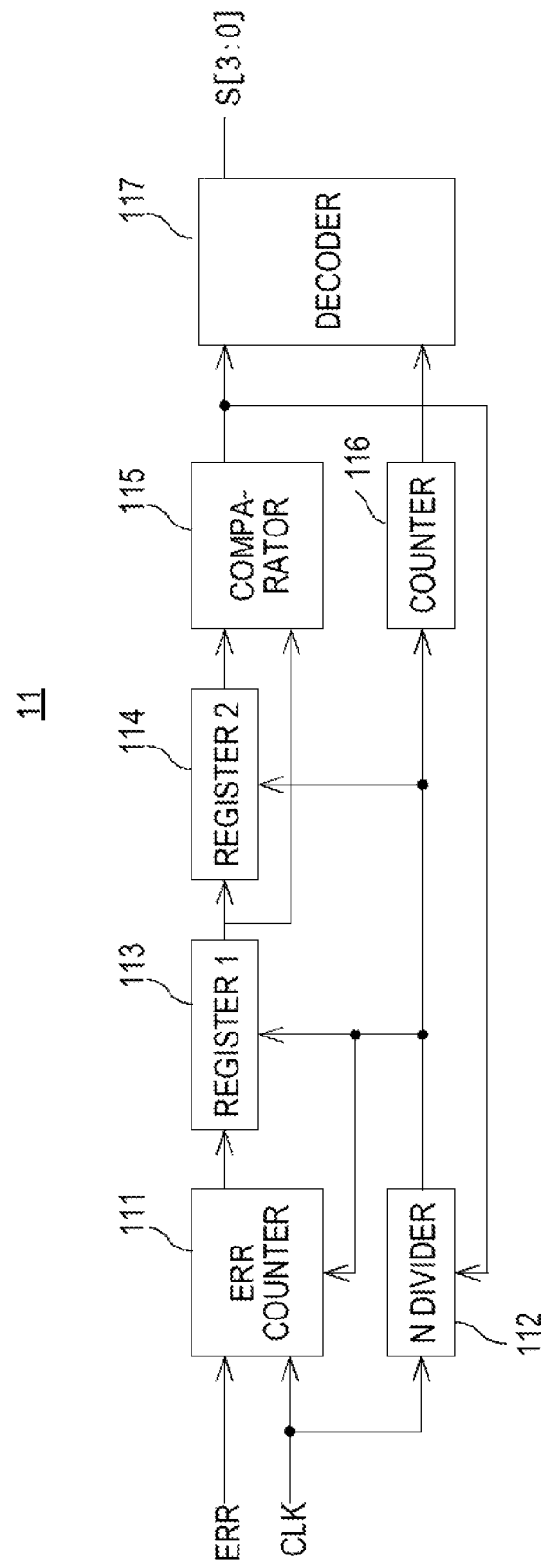
FIG. 8 is a block diagram illustrating one example of the duty adjustment control logic that achieves the duty adjustment processing illustrated in FIG. 7.

FIG. 7 illustrates a flowchart illustrating a duty adjustment processing in the duty adjustment circuit illustrated in FIG. 5. FIG. 8 illustrates a block diagram illustrating one example of duty adjustment control logic to achieve the duty adjustment processing illustrated in FIG. 7.

As illustrated in FIG. 7, once a duty adjustment processing is started, in Operation ST1, the switch A-SW is selected (turned on) and the number of bubble detection signals ERR is counted for a given period (for example, a period of 1024 clock cycles). The process proceeds to Operation ST2. In Operation ST2, an ERR counter 111 counts the number of bubble detection signals ERR, and stores the counted results (the number of A) in a register 113.

The process proceeds to Operation ST3, and the switch B-SW is selected and the number of bubble detection signals ERR is counted for a given period. The process proceeds to Operation ST4. In Operation ST4, the ERR counter 111 counts the number of bubble detection signals ERR, and stores the counted results (the number of B) in the register 113.

In Operation ST2, the count result (the number of A) stored in the register 113 in Operation ST2 is shifted to and stored in the register 114.

The process proceeds to Operation ST5 to determine whether or not "A" is equal to or greater than "B." In other words, a comparator 115 compares the output of the register 113 (B) with the output of the register 114 (A).

In Operation ST5, when "A" is equal to or greater than "B" is not established, in other words, it is determined that reducing a sampling time and extending a comparison time increases the number of bubble detection signals ERR (A<B), the process proceeds to Operation ST15 and the switch A-SW is selected to complete the duty adjustment processing.

In this case, the duty ratio (a sampling processing time for one clock cycle) remains at 50%, and therefore, the comparison processing time for one clock cycle also remains at 50%.

On the other hand, in Operation ST5, when it is determined that "A" is equal to or greater than "B" is established, the process proceeds to Operation ST 6 to select the switch C-SW and count the number of the bubble detection signals ERR in a given period and proceeds to Operation ST7. In Operation ST7, the ERR counter 111 counts the number of bubble detection signals ERR, and stores the counted results (the number of C) in a register 113.

At this time, the count result (the number of B) stored in the register 113 in Operation ST4 is shifted to and stored in the register 114. The count result stored in the register 114 (the number of A) is discarded.

The processing proceeds to the step ST8 to determine whether or not "B" is equal to or greater than "C." In other words, the comparator 115 compares the output of the register 113 (C) with the output of the register 114 (B).

In Operation ST8, if it is determined that "B" is equal to or greater than "C" is not established, in other words, reducing a sampling time further and extending a comparison time increases the number of the bubble detection signals ERR (B is less than C), the process proceeds to Operation ST 14. In Operation ST 14, a switch B-SW is selected to complete a duty adjustment processing. In this case, the comparison processing time for one clock cycle becomes larger than 50% (for example, 60%).

On the other hand, in Operation ST8, if it is determined that "B" is equal to or greater than "C", the process proceeds to Operation ST9 to select a switch D-SW and count the number of the bubble detection signals ERR for a given period and the process proceeds to Operation ST10. In Operation ST10, the ERR counter 111 counts the number of bubble detection signals ERR and stores the count result (the number of D) in the register 113.

In Operation ST7, the count result stored in the register 113 (the number of C) at Operation ST7 is shifted to and stored in the register 114 and the count result stored in the register 114 (the number of B) is discarded.

The process proceeds to Operation ST11 and whether or not "C" is equal to or greater than "D" is determined. In other words, the comparator 115 compares the output of the register 113 (D) with the output of the register 114 (C) in FIG. 8.

In Operation ST11, if it is determined that "C" is equal to or greater than "D" is not established, in other words, reducing a sampling time further and extending a comparison time increases the number of the bubble detection signals ERR (C is less than D), the process proceeds to Operation ST 13. In Operation ST13, a switch C-SW is selected to complete a duty adjustment processing. In this case, the comparison processing time for one clock cycle becomes larger than 60% (for example, 70%).

On the other hand, in Operation ST11, if it is determined that "C" is equal to or greater than "D" is established, the process proceeds to Operation ST12. The switch D-SW is selected to complete the duty adjustment processing. In this case, the comparison processing time for one clock cycle becomes larger than 70% (for example, 80%).

In FIG. 8, an N-divider 112 supplies a signal obtained by dividing a reference clock CLK into N stages (for example, eight stages) to the ERR counter 111, the registers 113 and 114, and the counter 116. The N-divider 112 determines a period for counting bubble detection signals ERR. The value of N is not limited to 8, for example, any value such as the above described 1024 may be set.

Accordingly, the ERR counter 111 that counts the bubble detection signals ERR is reset by a given interval specified by an output signal from the N-divider 112. The registers 113 and 114 transfer data to the latter stage substantially in synchronization with a rising edge of an output signal from the N-divider, and take in and store the supplied data.

The counter 116 counts rising edges from output signals from the N divider 112 and monitors which of the switches is turned on and supplies an output signal to the decoder 117.

An output from the comparator 115 is supplied to the N-divider 112 as well and, depending on the comparison result, the duty adjustment processing of the comparator control signal is completed. The decoder 117 decodes and outputs switch control signals S0 to S3 depending on outputs from the comparator 115 and the counter 116.

A bubble detection signal ERR is output when a bubble is generated at any of thermometer codes for one cycle of a reference clock CLK (comparator control signal CNT1). Thus, for example, accuracy of A/D conversion may be improved by reducing the number of the outputs of bubble detection signals ERR during a 1024 clock cycle.

Figure 9:
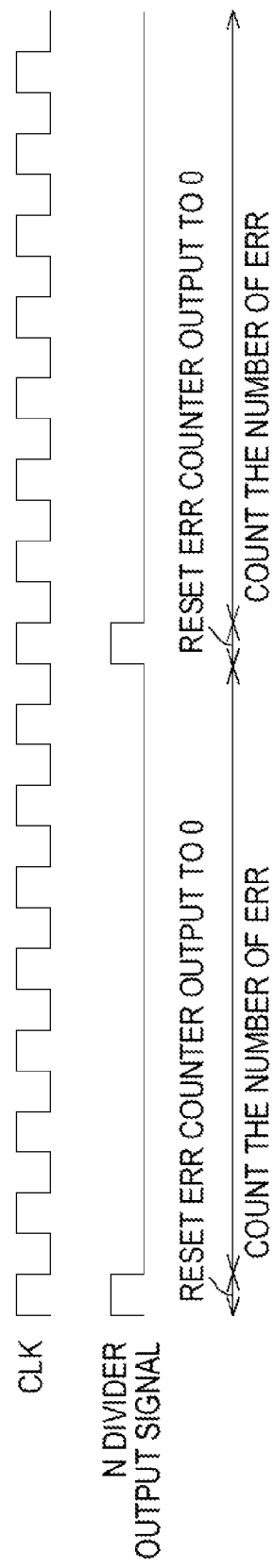
FIG. 9 illustrates one example of an output waveform of an N divider in the duty adjustment control logic illustrated in FIG. 8.

FIG. 9 illustrates one example of an output waveform of an N-divider in the duty adjustment control logic illustrated in FIG. 8. FIG. 9 illustrates one example of an output waveform of the N-divider 112 when N=8.

As described above, an N value (a frequency dividing number) set in the N-divider 112 determines a period for counting bubble detection signals ERR and the number is not limited to 8 but any value such as 1024 may be set.

In the above described embodiment, a case is described in which analog input signals are converted into digital signals to output 3-bit outputs D0 to D2. However, this is just an example for simplifying the explanation, and various configurations may be applied. The above described given period is not necessarily 1024 clock cycles but various values may be set.

Figure 10:
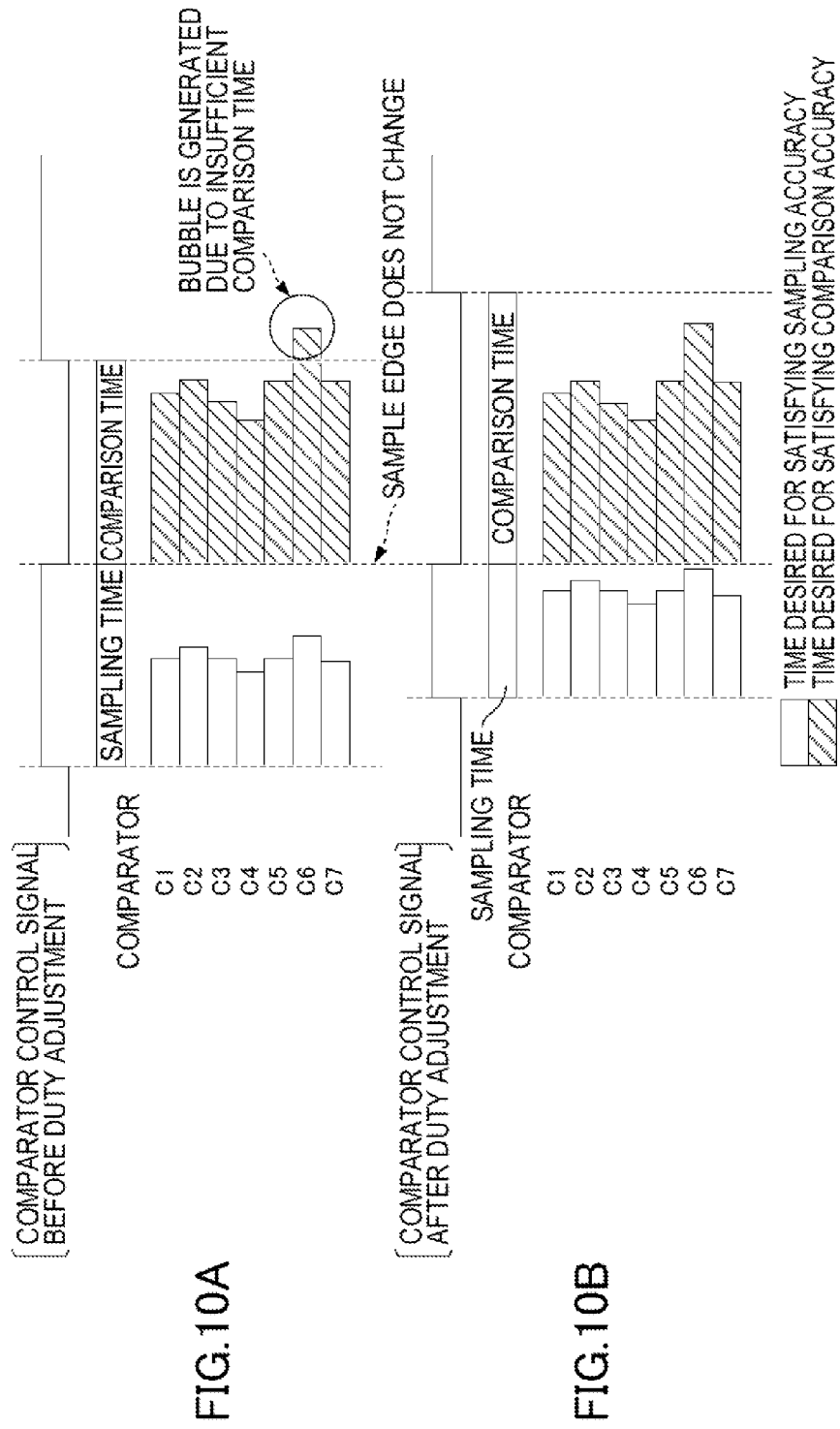
FIG. 10 illustrates an operation of the A/D converter in FIG. 4 by comparing with that of a conventional example of the A/D converter.

FIG. 10 illustrates an operation of the A/D converter illustrated in FIG. 4 compared to a conventional example. FIG. 10 (a) illustrates an operation of a comparator control signal before adjusting a duty, while FIG. 10 (b) illustrates an operation of a comparator control signal after adjusting the duty.

In other words, a ratio of a sampling time for one cycle time of a comparator control signal (duty ratio) is 50% in FIGS. 10(a) and 33% (⅓) in FIG. 10(b).

As illustrated in FIG. 10 (a), when a duty ratio of a sampling time is 50%, in other words, when a comparison time is a half of one cycle, a bubble is generated in a thermometer code of the comparator C6 due to insufficient comparison time.

On the other hand, as illustrated in FIG. 10 (b), when a duty ratio of a sampling time is 33%, in other words, a comparison time is ⅔ of one cycle, comparison processing for all comparators C1 to C7 including the comparator C6 is completed within the comparison time. This achieves correct sampling and comparison processing and output of thermometer codes without any bubble.

In the above example, a case is described in which a duty ratio of a sampling time is smaller than 50% (in other words, a ratio of a comparison time is longer than 50%).

However, the comparator processing includes not only a case in which a long comparison time that exceeds a half of one cycle is desired but also a case in which a long sampling time that exceeds a half of one cycle is desired. Thus, an embodiment that supports both cases is described by referring to FIG. 11 and FIG. 12.

Figure 11:
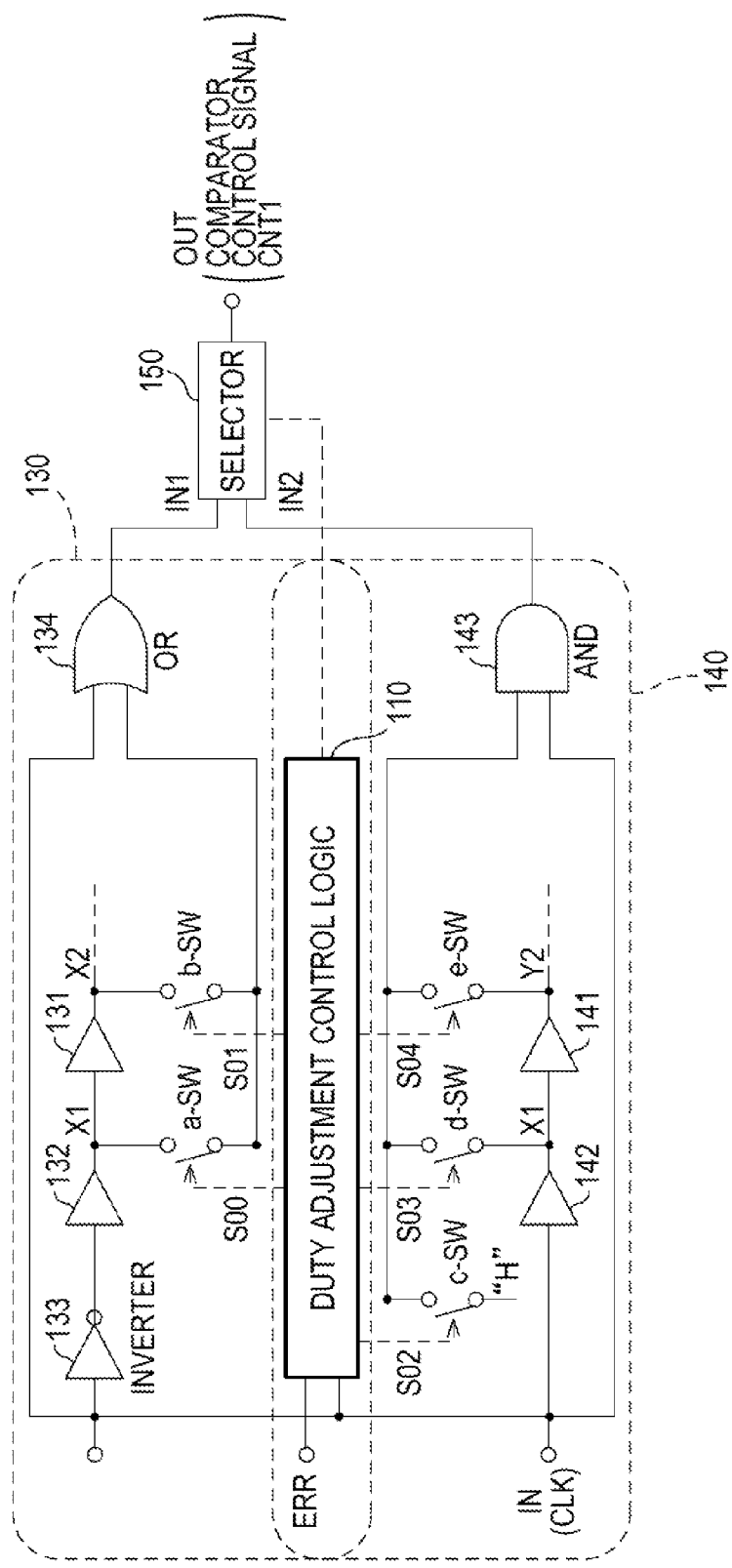
FIG. 11 is a block diagram illustrating one example of a duty adjustment circuit according to other embodiment of the A/D converter.

FIG. 11 illustrates a block diagram illustrating an example of a duty adjustment circuit according to another embodiment of the A/D converter.

As illustrated in FIG. 11, a duty adjustment circuit of the A/D converter according to this embodiment includes a duty adjustment logic 110, two duty adjustment blocks 130 and 140, and a selector 150.

The duty adjustment block 130 includes delay buffers 131 and 132, an inverter 133, an OR gate 134, and switches a-SW and b-SW. The duty adjustment block 140 includes delay buffers 141 and 142, an AND gate 143, and switches c-SW, d-SW, and e-SW.

As described above, the numbers of switches and stages of delay buffers in the duty adjustment blocks 130 and 140 may be changed depending on the frequencies of a reference clock CLK, a delay time of a delay buffer, and accuracy of a duty adjustment.

In the duty adjustment block 130, the reference clock CLK is inverted by the inverter 134, and the inverted reference clock is delayed by the delay buffer 132 and the delay buffer 131. One end of switch a-SW and one end of switch b-SW are input to the OR gate 134 together with a reference clock CLK, and an OR output is supplied to the first input IN1 of the selector 150. The other ends of the switches a-SW and b-SW are coupled to a node X1 and a node X2, respectively.

In the duty adjustment block 140, the reference clock CLK is delayed by the delay buffer 142 and the delay buffer 141. One end of each of the switches c-SW to e-SW are input to the AND gate 143 together with the reference clock CLK, and an AND output is supplied to a second input IN of the selector 150. The other ends of the switches d-SW and e-SW are coupled to a node Y1 and a node Y2 respectively, and the other end of the switch c-SW is set to high level "H."

The duty adjustment control logic 110 turns on one of the switches a-SW to e-SW and selects one of the first input or the second input of the selector 150, and a comparator control signal is output as an output of the selector 150.

Figure 12:
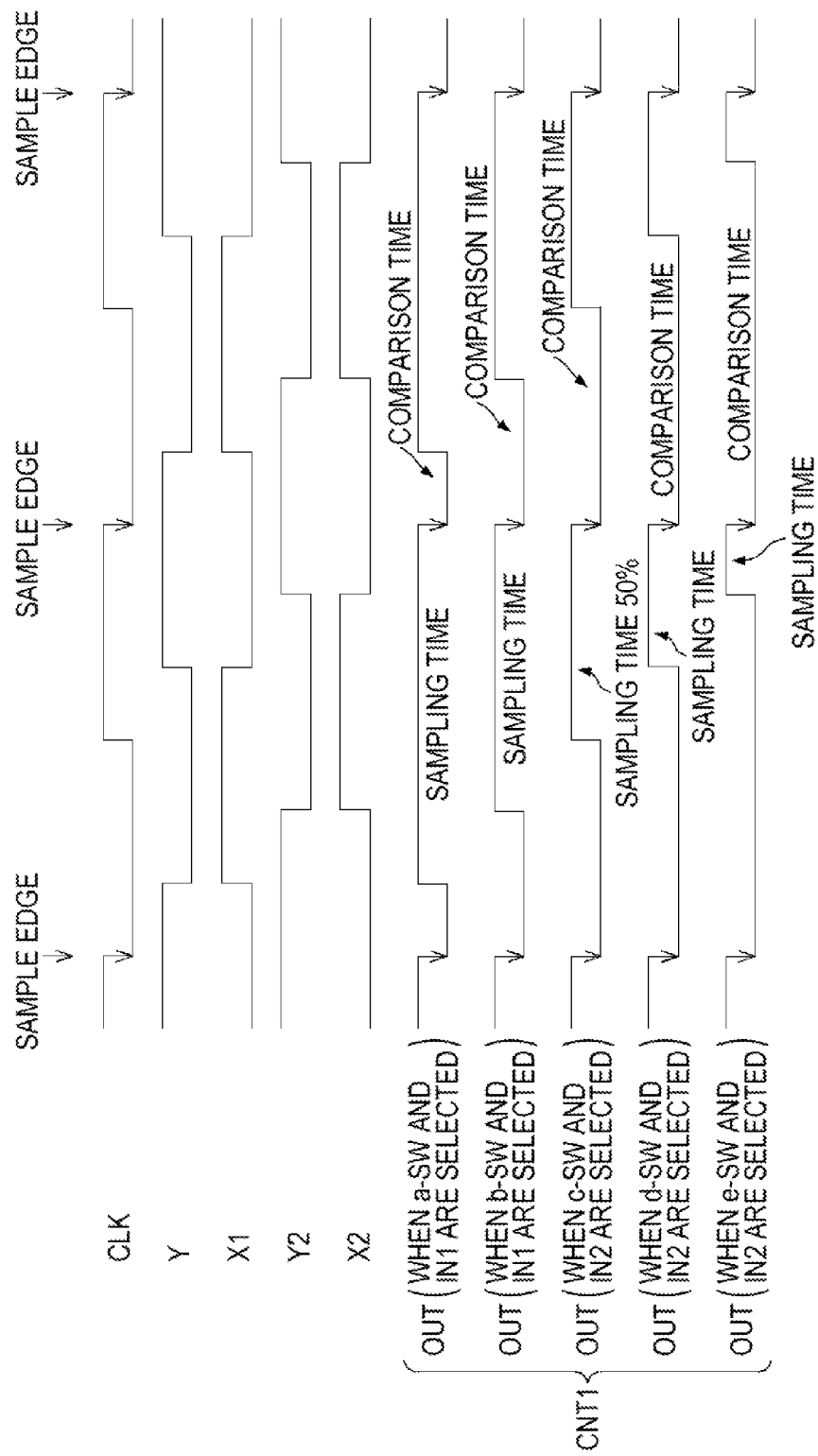
FIG. 12 illustrates input and output signals of the duty adjustment circuit illustrated in FIG. 11.

FIG. 12 illustrates an input and an output signal of a duty adjustment circuit illustrated in FIG. 11.

FIG. 12 illustrates a comparator control signal CNT1 when a reference clock CLK, each of nodes Y1, X1, Y2 and X2, and each of switches a-SW to e-SW are selected.

In other words, the comparator control signal CNT1 allows adjusting a duty ratio of a sampling time, for example, above or below 50% such as 17%, 33%, 50%, 67%, and 83%. Hence, a ratio of a comparison time may be correspondingly adjusted above or below 50%.

The sample edge in the duty adjustment circuit illustrated in FIG. 12 does not shift forward or backward regardless of the duty adjustment result, therefore, the duty adjustment circuit may be used during the A/D converter is in operation. In order to simplify the explanation in FIG. 11 and FIG. 12, a ratio of a sampling time and a comparison time is adjusted at five stages; however the ratio may be changed as required.

One example of an encoder of the A/D converter according to this embodiment will be described by referring to FIGS. 13 to 20.

An embodiment in FIG. 4 illustrates the encoder 2 that processes a 7-bit thermometer code of the outputs O1 to O7 of the comparators C1 to C7 and outputs a 3-bit digital signal. Whereas the encoder that will be described by referring to FIGS. 13 to 20 processes 31-bit thermometer codes e1 to e31 to output 5-bit digital signals B0Z to B4Z.

Figure 13:
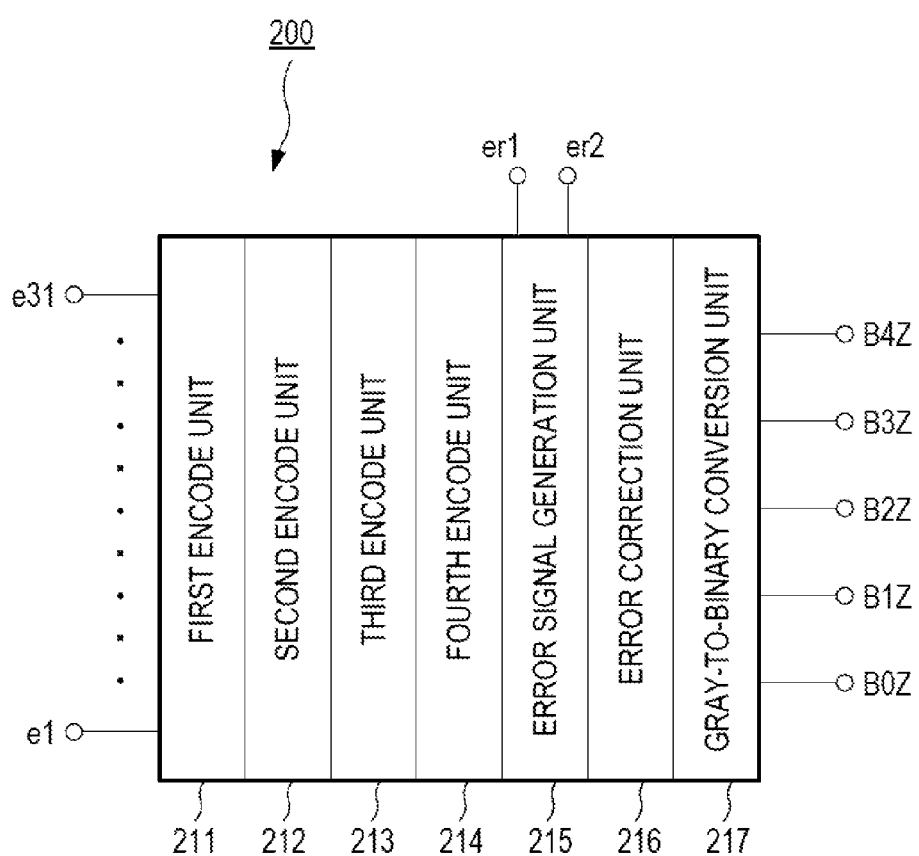
FIG. 13 illustrates a schematic view of an example of an encoder.

FIG. 13 illustrates a schematic view of an example of an encoder.

As illustrated in FIG. 13, the encoder 200 includes a first encode unit 211, a second encode unit 212, a third encode unit 213, a fourth encode unit 214, an error signal generation unit 215, an error correction unit 216, and a Gray-to-binary conversion unit 217.

The first to the fourth encode units 211 to 214 generate a 5-bit Gray code according to thermometer codes e1 to e31. The error signal generation unit 215 detects bubbles in the thermometer codes e1 to e31 based on the generated Gray codes and outputs a bubble detection signal ERR.

Figure 14:
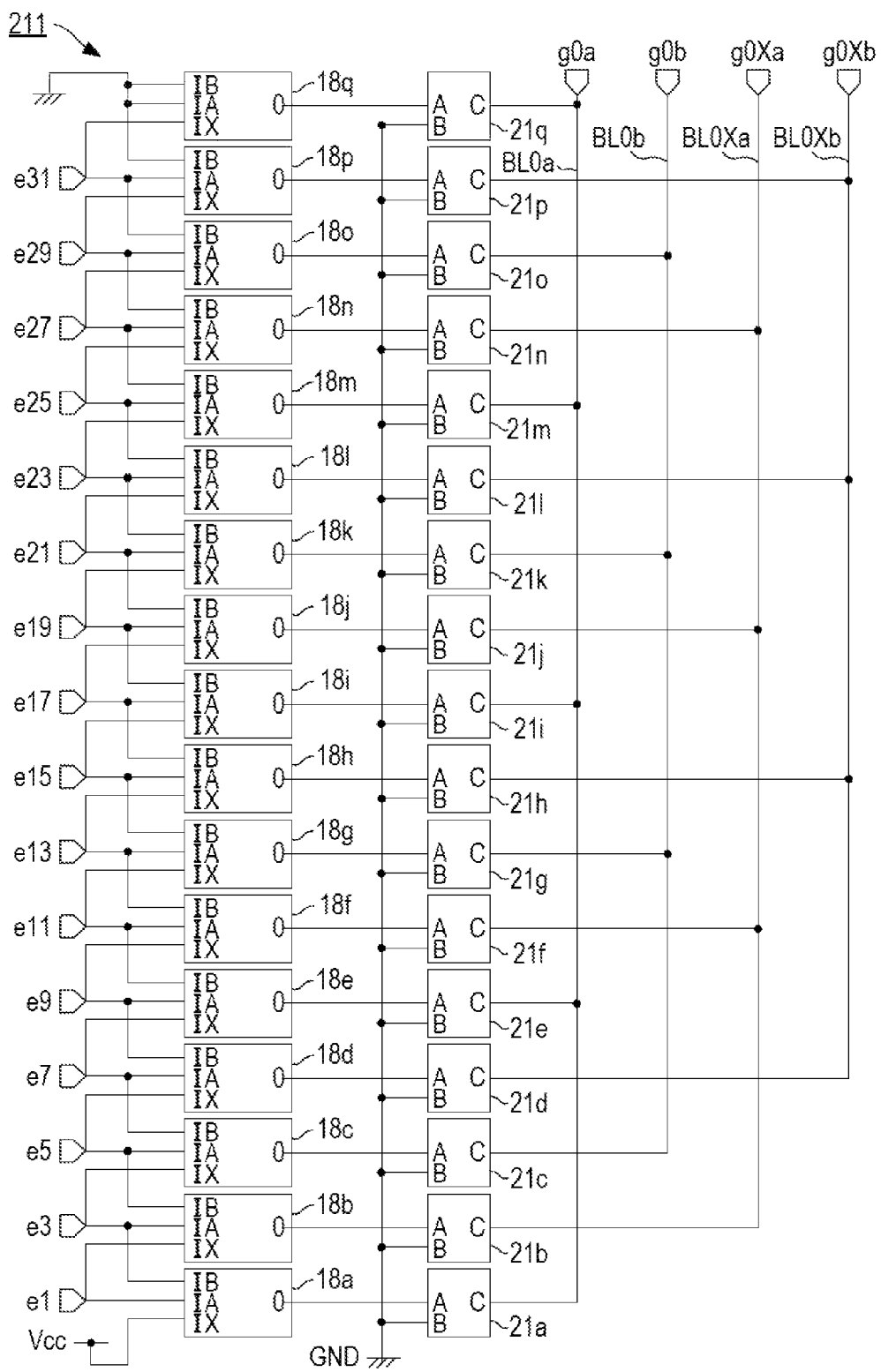
FIG. 14 illustrates one example of a first encode unit in the encoder illustrated in FIG. 13.

As illustrated in FIG. 14, the first encode unit 211 includes logical border detection circuits 18a to 18q that receive thermometer codes of odd numbers e1, e3 to e31, and ROM cells 21a to 21q. The first input A of each of the ROM cells 21a to 21q is coupled to corresponding logical border detection circuits 18a to 18q respectively and the second input B is grounded (GND). Gray codes g0a, g0b, g0Xa, and g0Xb are taken out through bit lines BL0a, BL0b, BL0Xa, and BL0Xb to which the ROM cells 21a to 21q are coupled.

Figure 15:
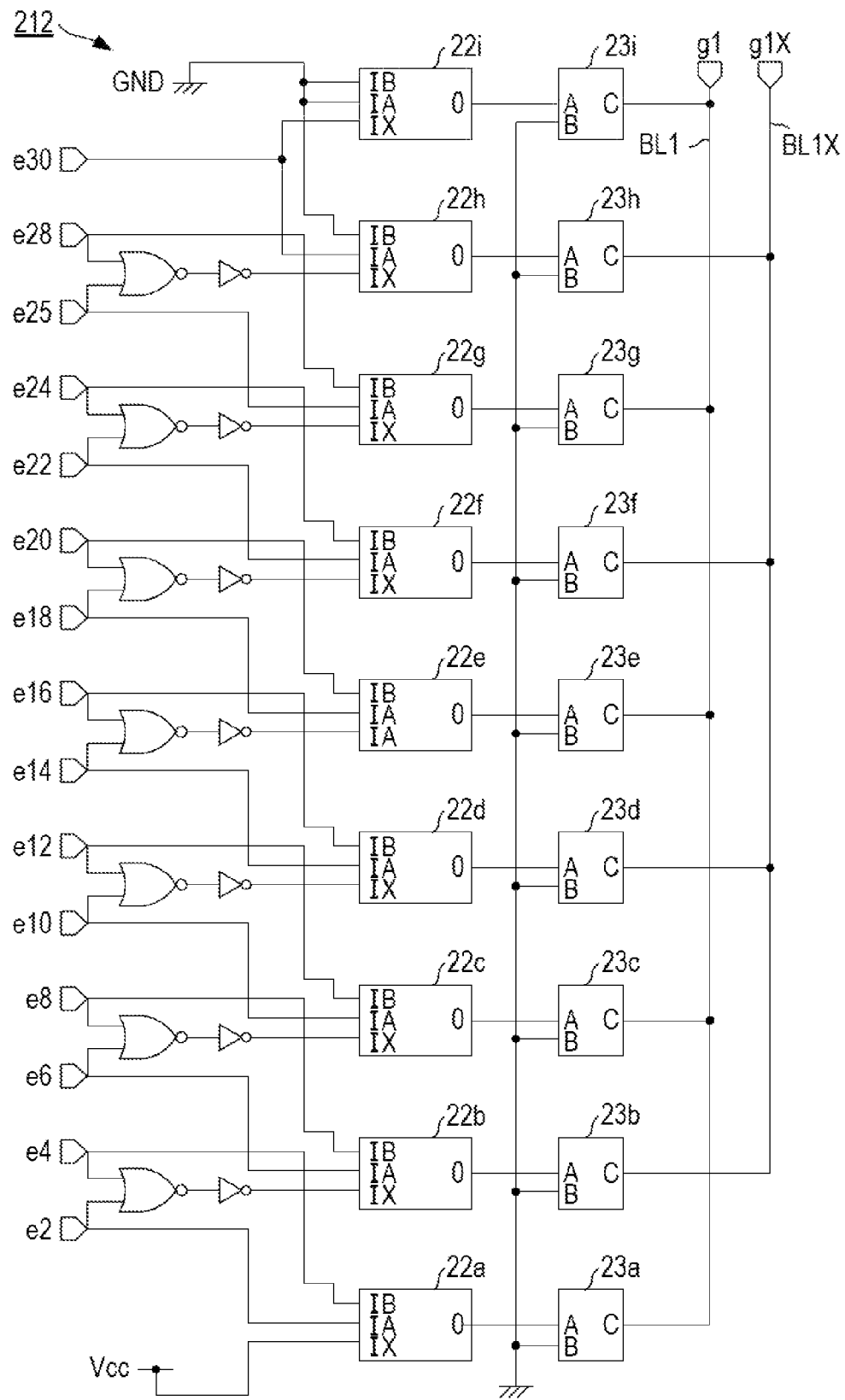
FIG. 15 illustrates one example of a second encode unit in the encoder illustrated in FIG. 13.

As illustrated in FIG. 15, the second encode unit 212 includes logical border detection circuits 22a to 22i that receive thermometer codes of even numbers e2, e4 to e30, and ROM cells 23a to 23i. The first input A of each of the ROM cells 23a to 23i is coupled to a corresponding output of logical border detection circuits 22a to 22i and the second input B is grounded (GND). Gray codes g1 and g1X are taken out through bit lines BL1 and BL1X to which the ROM cells 23a to 23i are coupled.

Figure 16:
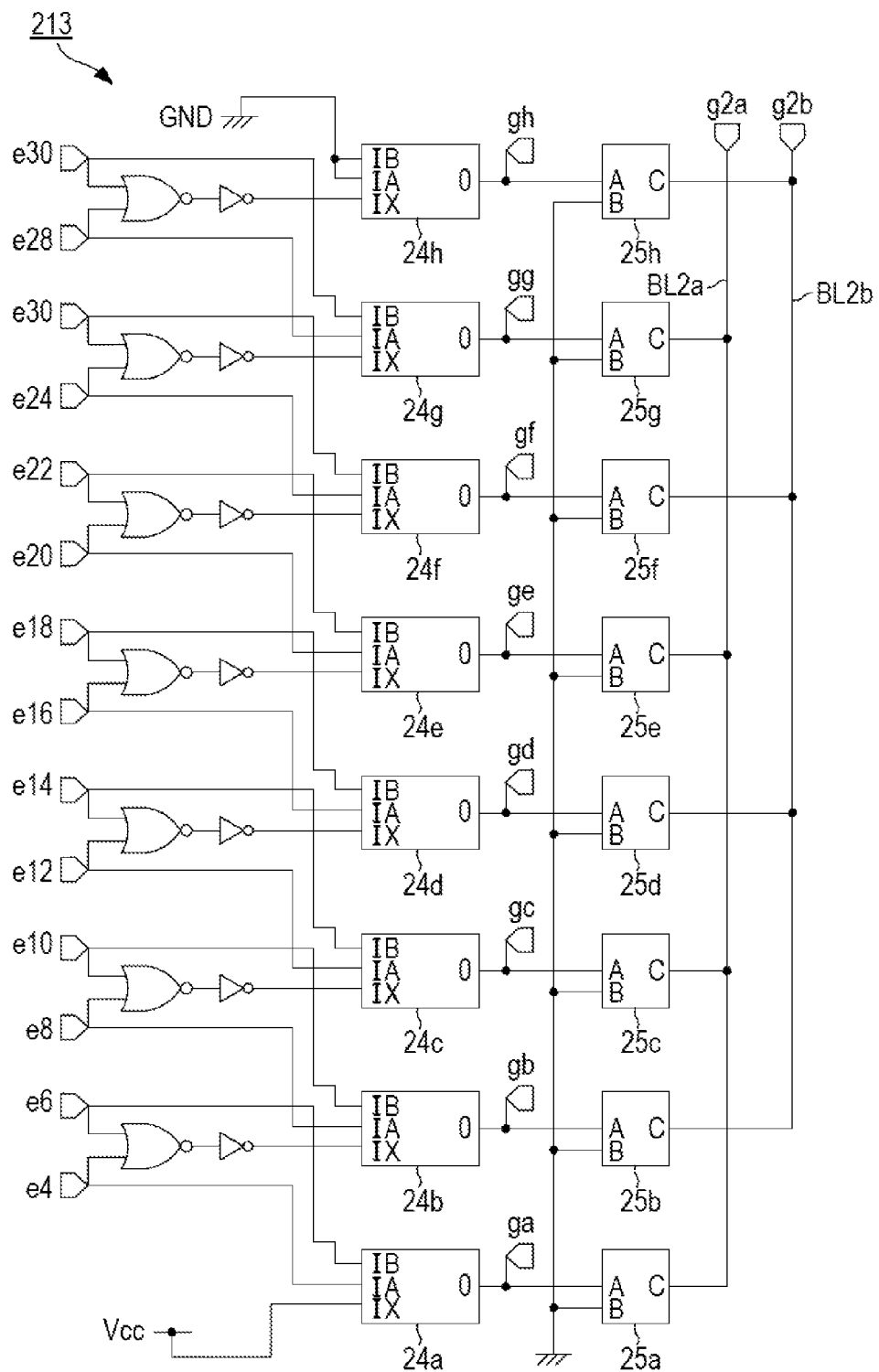
FIG. 16 illustrates one example of a third encode unit in the encoder illustrated in FIG. 13.

As illustrated in FIG. 16, the third encode unit 213 includes logical border detection circuits 24a to 24h that receive thermometer codes of even numbers other than e2, in other words, e4, e8 to e30, and ROM cells 25a to 25h. The first input A of each of ROM cells 25a to 25h is coupled to corresponding logical border detection circuits 24a to 24h and the second input B is grounded (GND). Binary codes g2a and g2b are taken out through bit lines BL2a and BL2b to which the ROM cells 25a to 25h are coupled. The output signals of the logical border detection codes are taken out as logical border detection signals ga to gh.

Figure 17:
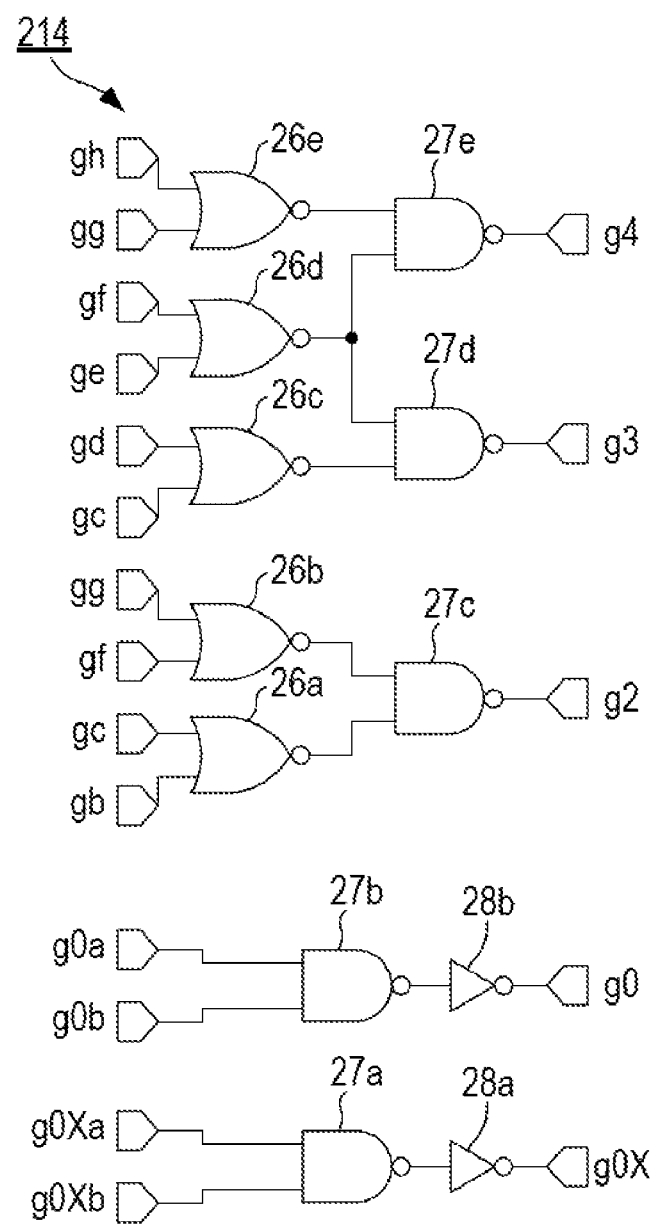
FIG. 17 is a circuit diagram illustrating one example of a fourth encode unit in the encoder illustrated in FIG. 13.

As illustrated in FIG. 17, the fourth encode unit 214 includes inverters 28a and 28b, NAND gates 27a to 27e, and NOR gates 26a to 26e.

The fourth encode unit 214 logically processes Gray code signals g0a, g0b, g0Xa, and g0xb and generates Gray codes g0 and g0X that are the lower two bits from the least significant bit. Moreover, the fourth encode unit 214 logically processes the logical border detection signals gb to gh to generate the Gray codes g2 to g4 that are the third to fifth bits from the least significant bit.

Figure 18:
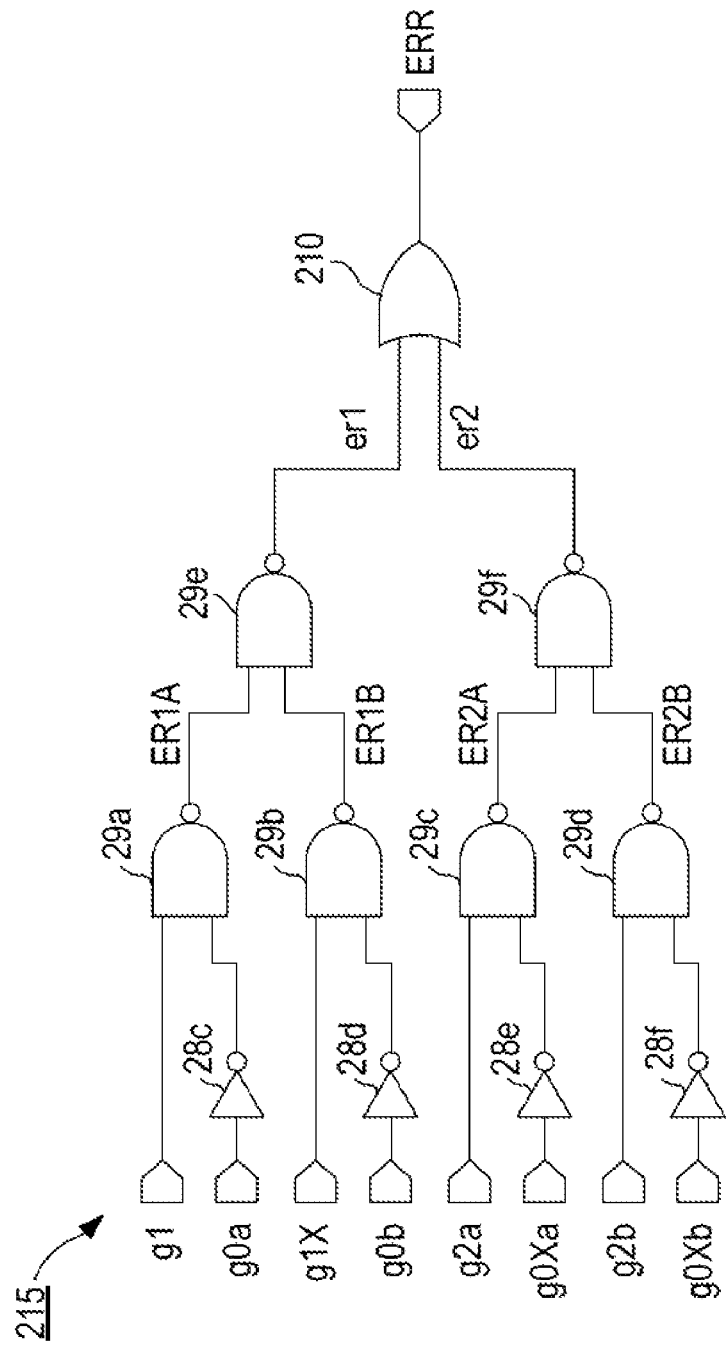
FIG. 18 is a circuit diagram illustrating one example of an error signal generation unit in the encoder illustrated in FIG. 13.

As illustrated in FIG. 18, the error signal generation unit 215 includes inverters 28c to 28f, NAND gates 29a to 29f, and an OR gate 210, and receives Gray code signals g0a, g0b, g0Xa, and g0Xb from the first encode unit 211.

Moreover, the error signal generation unit 215 receives Gray code signals g1 and g1X from the second encode unit 212 and binary codes g2a and g2b from the third encode unit 213. The error signal generation unit 215 logically processes these signals and generates a bubble detection signal ERR. The bubble detection signal ERR is a signal obtained through the OR gate 210 by a logical sum of a bubble error signal er1 and a bubble error signal er2.

Figure 19:
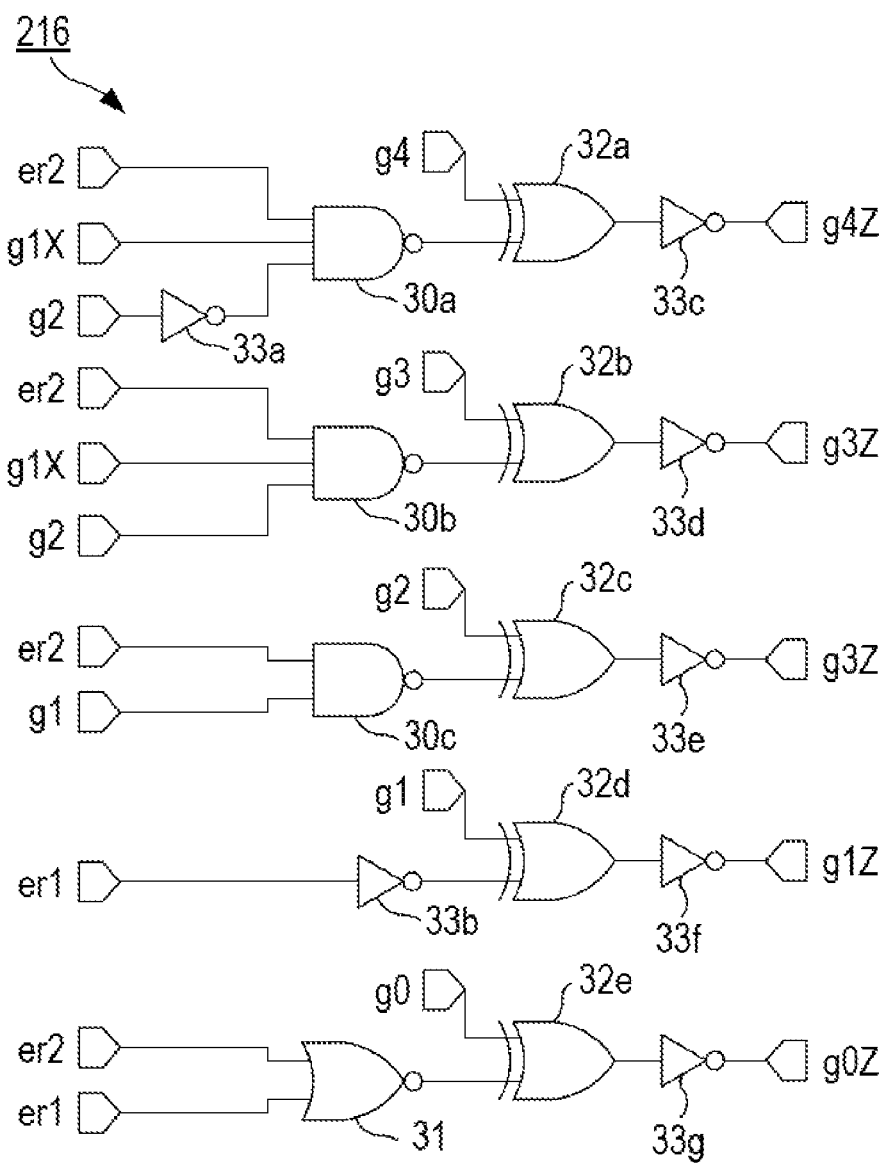
FIG. 19 is a circuit diagram illustrating one example of an error correction unit in the encoder illustrated in FIG. 13.

As illustrated in FIG. 19, the error correction unit 216 includes inverters 33a to 33g, NAND gates 30a to 30c, and an NOR gate 31, and XOR gates 32a to 32e.

The error correction unit 216 receives bubble error signals er1 and er2 from the error signal generation unit 215, and Gray codes g1 and g1X from the second encode unit 212, and a Gray code g2 from the fourth encode unit 214. The error correction unit 216 logically processes these signals and generates the corrected Gray codes g0Z to g4Z.

When the error correction unit 216 detects a bubble while the above described duty adjustment of the comparator control signal is performed in the background of the A/D converter, the error correction unit 216 may ignore the bubble and correct an error in the Gray code.

As illustrated in FIG. 20, the Gray-to-binary conversion unit 217 may include inverters 34a and 34b, and XOR gates 35a to 35d. The Gray-to-binary conversion unit 217 may generate binary codes B0Z to B4Z from the corrected Gray codes g0Z to g4Z supplied through the error correction unit 216.

The encoder described by referring to FIGS. 13 to 20 is just one example and encoders with various configurations may be applied.

According to each of the embodiments, occurrence of bubbles in thermometer codes may be reduced, and thereby an A/D converter with higher accuracy may be provided.

All examples and conditional language recited herein are intended for pedagogical purposes to aid the reader in understanding the principles of the invention and the concepts contributed by the inventor to furthering the art, and are to be construed as being without limitation to such specifically recited examples and conditions, nor does the organization of such examples in the specification relate to a showing of the superiority and inferiority of the invention. Although the embodiments of the present inventions have been described in detail, it should be understood that the various changes, substitutions, and alterations could be made hereto without departing from the spirit and scope of the invention.

What is claimed is:

1. An A/D converter comprising:
a plurality of comparators that performs sampling of a plurality of reference voltages and analog input signals during a sampling time, and compares each of the plurality of reference voltages with the analog signals during a comparison time, wherein
the A/D converter detects bubbles in thermometer codes obtained from output signals of the plurality of comparators and adjusts a ratio of the sampling time and the comparison time of the plurality of comparators so as to reduce the bubbles.

2. The A/D converter according to claim 1, comprising
a control signal generation circuit that generates a comparator control signal defining the sampling time and the comparison time of the plurality of comparators, wherein
the A/D converter supplies the comparator control signal to the plurality of comparators.

3. The A/D converter according to claim 2, wherein
the control signal generation circuit counts the number of bubbles generated in a first cycle period of the comparator control signal, and adjusts the comparator control signal so as to reduce a count value of the bubbles.

4. The A/D converter according to claim 1, further comprising
a reference voltage generation circuit that generates the plurality of reference voltages.

5. The A/D converter according to claim 1, further comprising
an encoder that outputs a first bit digital signal by encoding the thermometer codes.

6. The A/D converter according to claim 5, wherein
the encoder detects a bubble in the thermometer code and supplies the first bit digital signal to the control signal generation circuit.

7. An A/D converter comprising:
a reference voltage generation circuit that generates a plurality of reference voltages;
a plurality of comparators that performs sampling of each of the reference voltages and analog input signals and compares the reference voltages with analog input signals;
a control signal generation circuit that generates a comparator control signal for controlling the plurality of comparators based on a reference clock;
an encoder that encodes thermometer codes obtained from the output signal of the plurality of comparators and outputs digital signals with given bits, wherein the encoder includes a bubble detection circuit that detects a bubble in the thermometer code and outputs a bubble detection signal;
wherein, the control signal generation circuit includes a duty adjustment circuit that receives the bubble detection signal and adjusts a duty ratio of the comparator control signal.

8. The A/D converter according to claim 7, wherein the duty adjustment circuit adjusts a ratio of a sampling time and a comparison time in one cycle of the comparator control signal.

9. The A/D converter according to claim 8, wherein the duty adjustment circuit adjusts the ratio of the sampling time and the comparison time in one cycle, and sets a timing that is substantially the same as a sample edge that switches from the sampling time to the comparison time.

10. The A/D converter according to claim 7, wherein the duty adjustment circuit counts the number of the bubble detection signals generated in one cycle period of the reference clock and adjusts the duty ratio of the comparator control signal so as to reduce a count value of the bubbles.

11. The A/D converter according to claim 7, wherein the adjustment of the duty ratio of the comparator control signal by the duty adjustment circuit is performed as a calibration of the A/D converter before starting operation.

12. The A/D converter according to claim 7, wherein the adjustment of the duty ratio of the comparator control signal by the duty adjustment circuit is performed in the background during operation of the A/D converter.

* * * * *